(12) United States Patent
Seki et al.

(10) Patent No.: US 7,301,226 B2
(45) Date of Patent: Nov. 27, 2007

(54) CONDUCTOR SUBSTRATE, SEMICONDUCTOR DEVICE AND PRODUCTION METHOD THEREOF

(75) Inventors: Kazumitsu Seki, Nagano (JP); Yoshihito Miyahara, Nagano (JP); Muneaki Kure, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 242 days.

(21) Appl. No.: 10/824,523

(22) Filed: Apr. 15, 2004

(65) Prior Publication Data

US 2004/0207056 A1 Oct. 21, 2004

(30) Foreign Application Priority Data

Apr. 16, 2003 (JP) .............................. 2003-112050
Feb. 20, 2004 (JP) .............................. 2004-044896

(51) Int. Cl.
*H01L 23/495* (2006.01)
(52) U.S. Cl. ................. 257/676; 257/E23.056
(58) Field of Classification Search ...................... None
See application file for complete search history.

(56) References Cited

U.S. PATENT DOCUMENTS

| | | | |
|---|---|---|---|
| 4,518,449 A * | 5/1985 | Kamada | 156/153 |
| 4,888,449 A | 12/1989 | Crane et al. | |
| 4,997,722 A * | 3/1991 | Adler | 428/596 |
| 5,459,103 A | 10/1995 | Kelleher et al. | |
| 5,785,791 A | 7/1998 | Letterman, Jr. et al. | |
| 5,861,076 A * | 1/1999 | Adlam et al. | 156/281 |
| 6,034,422 A * | 3/2000 | Horita et al. | 257/677 |
| 2002/0152596 A1* | 10/2002 | Tsubosaki et al. | 257/666 |
| 2003/0044597 A1* | 3/2003 | Nagai et al. | 428/336 |
| 2003/0227073 A1* | 12/2003 | Yurino | 257/666 |

FOREIGN PATENT DOCUMENTS

| | | |
|---|---|---|
| JP | 60-201651 | 12/1985 |
| JP | 3-295262 | 12/1991 |
| JP | 9-148509 | 6/1997 |
| JP | 2001-210776 | 8/2001 |
| JP | 2002-231871 | 8/2002 |

* cited by examiner

*Primary Examiner*—Sue A. Purvis
*Assistant Examiner*—Benjamin P. Sandvik
(74) *Attorney, Agent, or Firm*—Staas & Halsey LLP

(57) ABSTRACT

A conductor substrate for mounting a semiconductor element, at least a portion thereof mounting the semiconductor element being sealed with an insulating resin, wherein an uppermost surface layer of the conductor substrate comprises copper or an alloy thereof, and the conductor substrate is partly or entirely covered with a layer of copper oxide containing a hydroxide formed upon the surface treatment of the conductor substrate and a process of producing the conductor substrate as well as a process for the production of a semiconductor device using the conductor substrate.

21 Claims, 17 Drawing Sheets

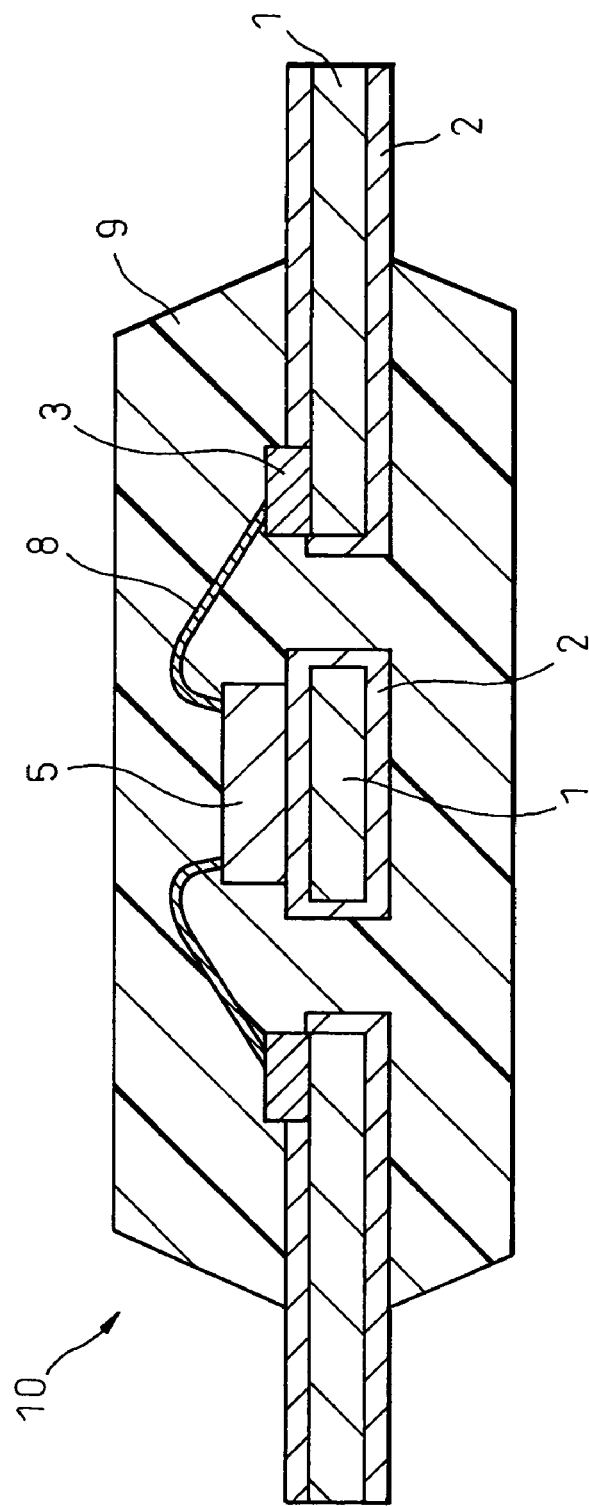

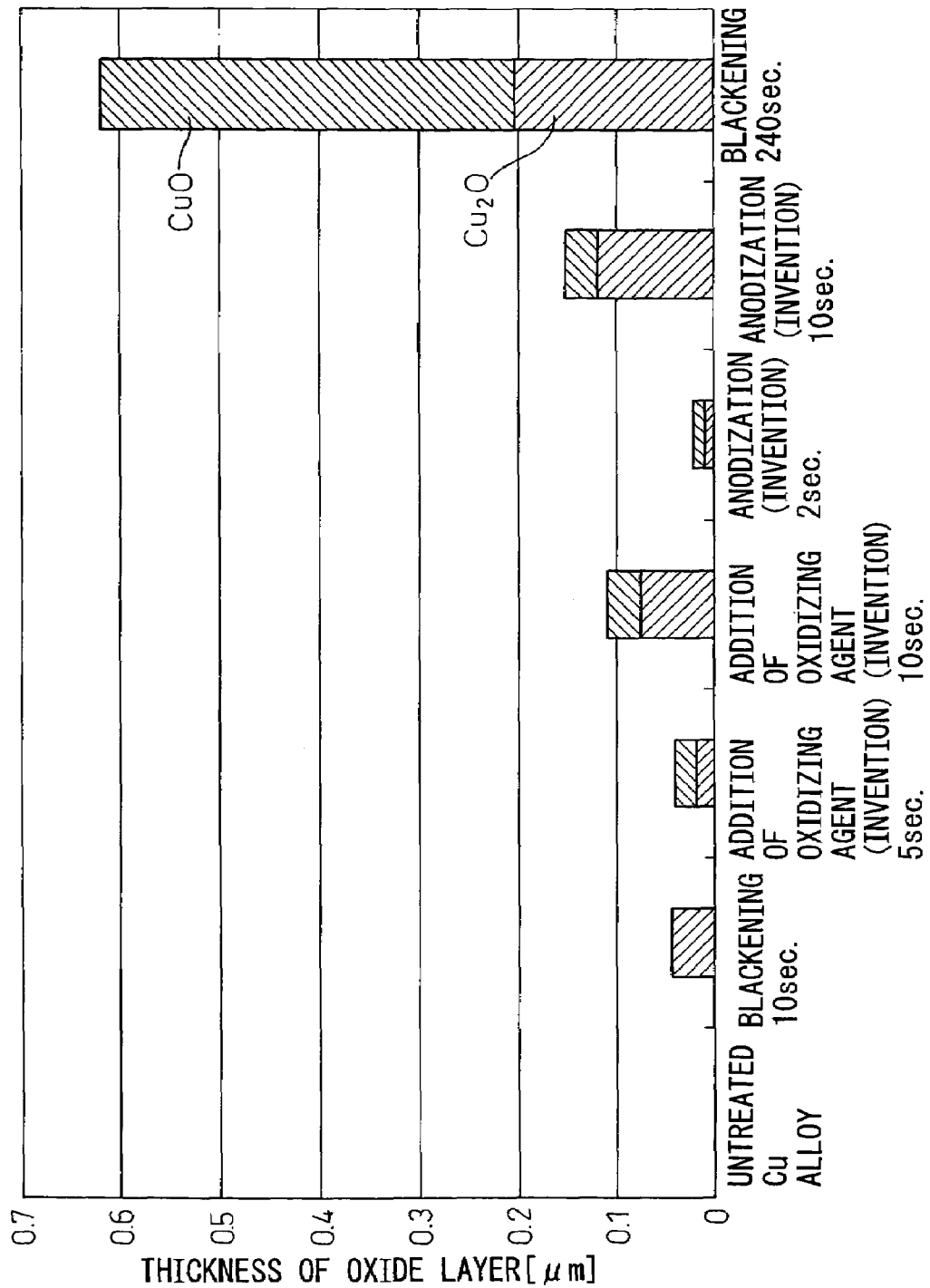

Ra : 6.0nm

Ra : 18.3nm

Fig.11
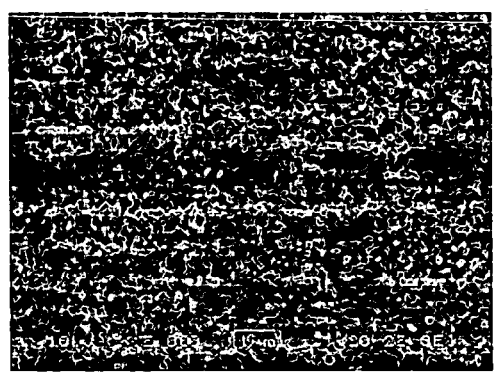
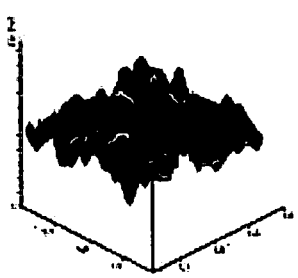
Ra : 17.0nm
Fig.12
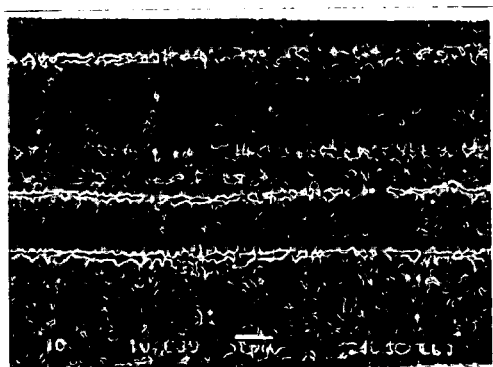
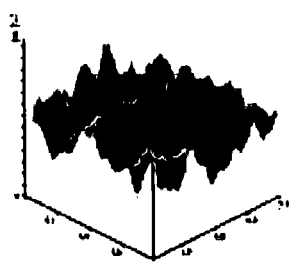
Ra : 14.9nm Ra : 36.6nm

CONDUCTOR SUBSTRATE, SEMICONDUCTOR DEVICE AND PRODUCTION METHOD THEREOF

BACKGROUND OF THE INVENTION

1. Field of the Invention

The present invention relates to a conductor substrate and a method of producing the same. More specifically, the invention relates to a conductor substrate useful for the production of a resin-sealed semiconductor device in which, after a semiconductor element is mounted, a portion mounting the element is sealed or covered with an insulating resin, and a method of producing the same. The invention is further concerned with a semiconductor device equipped with the above conductor substrate and a method of producing the same.

2. Description of Related Art

As is well known, there have been proposed a variety of semiconductor devices comprising a semiconductor element such as an IC chip or an LSI chip mounted on a substrate, and one of them is a resin-sealed semiconductor device in which a semiconductor element is mounted, and a portion mounting the semiconductor element is sealed with an insulating resin. The resin-sealed semiconductor device has a semiconductor element mounted on a conductor substrate such as a lead frame, along with necessary electric connection, and is often called a "semiconductor package". The semiconductor packages are generally stored by the manufacturers after they are manufactured, and are offered to end users, depending upon their demand. Then, the end users mount the semiconductor packages on the substrates such as wiring boards by, for example, reflowing a solder to complete the final electronic equipment.

In the prior art process for producing electronic equipment, some problems have been found. One of the problems is caused during storage of the semiconductor devices. This is because, the resin sealing the semiconductor device tends to absorb moisture in the air while the semiconductor device is being stored until it is mounted on the substrate. The moisture absorbed by the sealing resin is rapidly vaporized and expanded due to the heat in the solder reflowing step (because a temperature of as high as about 180 to 200° C. is applied in this step) at the packaging the semiconductor device, producing a large stress in the sealing resin itself. As a result, cracks occur in the interface between the conductor substrate or the semiconductor element and the sealing resin, or the sealing resin peels off the conductor substrate. Such defects deteriorate the reliability of the semiconductor devices. It is therefore desired to provide a conductor substrate that is capable of sufficiently withstanding the stress due to vaporization and expansion of the moisture intimately adhering to the sealing resin or, in other words to provide a semiconductor device that can be stably stored for an extended period of time maintaining excellent adhesion.

Further, in recent years, from the standpoint of protecting global environment, there has been employed a lead-free solder instead of the conventional lead-containing solder in the step of solder reflowing in packaging the semiconductor device on the substrate. However, the lead-free solder has a melting point higher than that of the conventional solders (the conventional solders have a melting point of about 200° C., while the lead-free solder has a melting point of about 240 to 260° C.). Inevitably, therefore, the solder reflowing step must be conducted at a high temperature. As the packaging temperature increases, however, a larger stress is exerted on the semiconductor device, developing defects such as cracks in increased amounts.

A further study has been carried out in an attempt to solve the above-mentioned problems. For example, there has been proposed a method of forming a black oxide layer on a lead frame as illustrated in FIG. 1 to improve the adhesion of the sealing resin to the lead frame relying upon the anchoring effect (see, Japanese Unexamined Patent Publication (Kokai) No. 9-148509). The lead frame 101 illustrated is a press-molded article of copper or a copper alloy, and comprises a chip-mounting portion 102, an internal lead portion 103, an external lead portion 104, and a wire-bonding portion 105. Silver layer 102a and 105a are plated on the upper surfaces of the chip-mounting portion 102 and of the wire-bonding portion 105. Further, a circuit chip 106 is mounted on the chip-mounting portion 102. The circuit chip 106 and the wire-bonding portion 105 are connected together through a wire 107. Further, the lead frame 101 as a whole is sealed with a sealing resin 108. In order to improve the adhesion between the lead frame 101 and the sealing resin 108 relying upon the anchoring effect, a black oxide layer (cupric oxide CuO layer) 109 is formed on the limited portions where the silver layers 102a and 105a have not been plated. The black oxide layer 109 is formed upon anodization of the lead frame 101 in an organic alkali solution.

Further, referring to FIG. 2, there has been proposed a method of interposing a layer of cuprous oxide ($Cu_2O$) between the conductor substrate and the blackened layer, i.e., black oxide layer (cupric oxide layer) so that the adhesion does not decrease between the conductor substrate and the sealing resin even when a high temperature is applied (see, Japanese Unexamined Patent Publication (Kokai) No. 2001-210776). Namely, the illustrated lead frame 113 is made of copper or a copper alloy, and has a cuprous oxide ($Cu_2O$) layer 114, a cupric oxide (CuO) layer 112 and a molding resin layer 115 formed thereon in this order. The cuprous oxide layer 114 can be formed by forming the cupric oxide layer 112 by immersing the lead frame 113 in an alkali bath so as to be blackened and, then, heating the lead frame 113 at a high temperature in an oxidizing atmosphere.

According to these prior art methods, however, there still remains room for improvement. With the method of forming a black oxide layer on the surface of the conductor substrate by the anodization, for example, the resulting black oxide layer becomes too thick and, besides, an extended period of time is required for forming the layer. With the method of interposing a cuprous oxide layer between the conductor substrate and the cupric oxide layer to cope with the reflowing step that uses the lead-free solder, on the other hand, the production step becomes complex and a considerably extended period of time is required until the production is finished.

SUMMARY OF THE INVENTION

It is, therefore, an object of the present invention to provide a conductor substrate that is capable of sufficiently withstanding the stress due to vaporization and expansion of the moisture and that ensures intimately adhesion of the sealing resin to the conductor substrate or, in other words, to provide a conductor substrate useful for the production of semiconductor devices that can be stably stored for an extended period of time while maintaining excellent adhesion.

It is another object of the present invention to provide a conductor substrate which permits the employment of a solder reflowing step using a lead-free solder at the time of packaging a semiconductor device on a wiring board.

It is still another object of the present invention to provide a method of producing a conductor substrate without requiring high temperatures or a treatment step that lasts for an extended period of time, i.e., a method of producing a conductor substrate which is particularly useful for the production of semiconductor devices.

Further, it is still another object of the present invention to provide a semiconductor device equipped with the above-mentioned conductor substrate and a method of producing the same.

The above and other objects of the invention will be easily understood from the following detailed description.

In one aspect thereof, the present invention resides in a conductor substrate for mounting a semiconductor element, at least a portion thereof mounting the semiconductor element being sealed with an insulating resin, wherein an uppermost surface layer of the conductor substrate comprises copper or an alloy thereof, and the conductor substrate is partly or entirely covered with a layer of copper oxide containing a hydroxide formed upon surface treatment of the conductor substrate.

In another aspect thereof, the present invention resides in a method of producing a conductor substrate for mounting a semiconductor element, followed by sealing at least a portion of the conductor substrate mounting the semiconductor element with an insulating resin, comprising the step of treating a surface of the conductor substrate, an uppermost surface layer of which is formed of copper or an alloy thereof, to partly or entirely cover the surface of the conductor substrate with a layer of copper oxide containing a hydroxide.

In still another aspects thereof, the present invention resides in a semiconductor device in which at least one semiconductor element is mounted on a predetermined position of a conductor substrate of the invention, and is sealed with an insulating resin, and a method of producing a semiconductor device which comprises the step of forming a layer of hydroxide-containing copper oxide on a conductor substrate by a method of the invention, followed by mounting a semiconductor element on a predetermined position of the conductor substrate, electrically connecting the semiconductor element with the conductor substrate, and sealing at least a portion mounting the semiconductor element with an insulating resin.

In addition, in another aspect thereof, the present invention resides in an electronic equipment comprising the semiconductor device of the invention mounted on a mounting substrate, and a method of producing the same.

As will be appreciated from the following detailed description, according to the present invention, it becomes possible to obtain a conductor substrate that is capable of sufficiently withstanding the stress due to vaporization and expansion of the moisture exhibiting particularly excellent adhesion property and, hence, to provide a semiconductor device that can be stably stored for an extended period of time while maintaining excellent adhesion.

Further, according to the present invention, there occurs no inconvenience even when high temperatures are used for packaging the semiconductor device on a wiring board making it possible to employ a solder reflowing step using a lead-free solder and, hence, to provide a semiconductor device that is also environmentally friendly.

Furthermore, according to the present invention, it becomes possible to produce a conductor substrate and a semiconductor device of the invention requiring neither high temperatures nor the treating step that lasts for an extended period of time. No need of using the treating apparatus that must withstand high temperatures is effective in improving the production line and in reducing the production cost and, further, overcoming problems involved in the high-temperature treatment, such as a change in the composition due to the self-decomposition or vaporization of the solution used, difficulty in controlling the temperature of the solution used and troubles involved in maintaining stable treatment. The step of treatment according to the invention can be conducted at a temperature of about 50 to 80° C. by using the existing apparatus requiring easy maintenance concerning the composition and temperature of the solution, making it possible to improve the quality of the conductor substrate and of the semiconductor device and to stably conduct the treatment.

BRIEF DESCRIPTION OF THE DRAWINGS

FIG. 3 is a sectional view illustrating a preferred embodiment of a resin-sealed semiconductor device according to the present invention;

FIG. 4 is a graph illustrating variations in the layer constitution of when copper oxide layers are formed by different methods inclusive of the method of the present invention;

FIG. 11 is a diagram illustrating the surface state of the copper alloy after black oxide treatment in the presence of an oxidation reinforcing agent according to the present invention with regard to a photograph taken by using a scanning electron microscope (SEM, ×10,000) and a surface analysis obtained by using an atomic force microscope (AFM, ×10,000);

FIG. 12 is a diagram illustrating the surface state of the copper alloy after anodization treatment according to the present invention with regard to a photograph taken by using a scanning electron microscope (SEM, ×10,000) and a surface analysis obtained by using an atomic force microscope (AFM, ×10,000);

DESCRIPTION OF THE PREFERRED EMBODIMENTS

Figure 1:
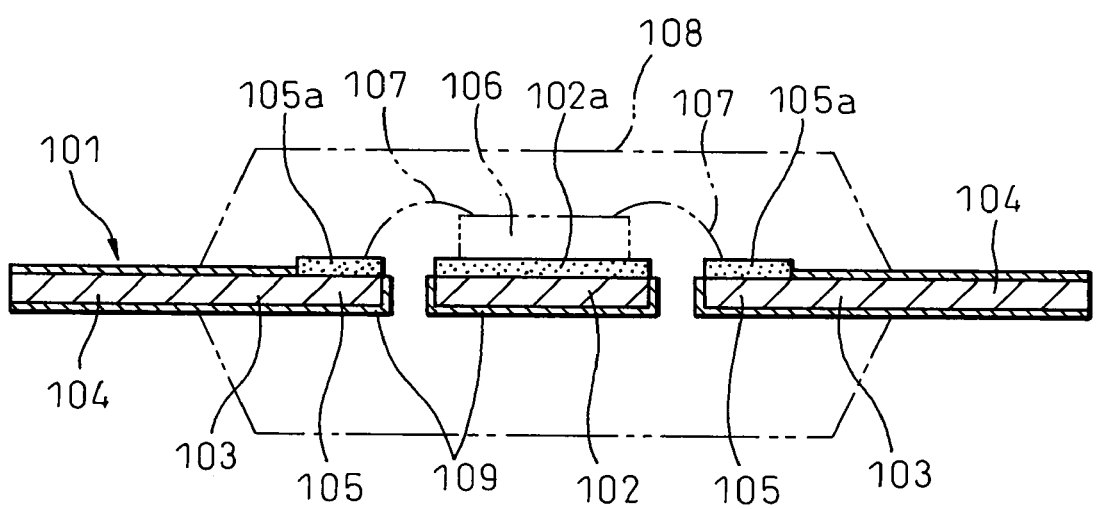
FIG. 1 is a sectional view illustrating a prior art resin-sealed semiconductor device.
Figure 2:
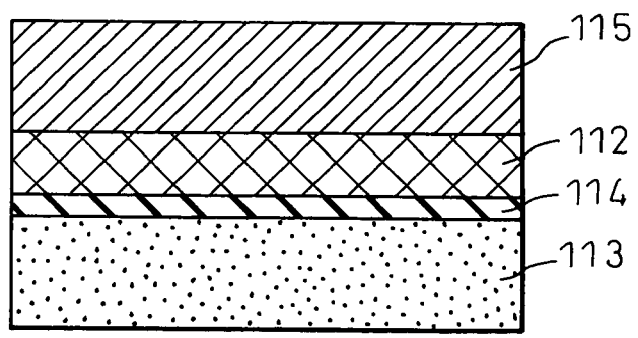
FIG. 2 is a sectional view illustrating a portion of another prior art resin-sealed semiconductor device.

The invention resides in a conductor substrate, a resin-sealed semiconductor device and their production methods as well as an electronic equipment comprising the semiconductor device of the invention packaged therein and a method of production of the same. The invention will now be described with reference to the accompanying drawings. Note, however, that the invention is in no way limited to the following embodiments only.

The present invention resides in a conductor substrate comprising a semiconductor element mounted thereon, at least a portion thereof mounting the semiconductor element being sealed with an insulating resin. The conductor substrate of the invention can be embodied in a variety of embodiments within the scope of the invention. The invention will now be described with reference to FIG. 3 that illustrates a semiconductor device using the conductor substrate of the invention.

A semiconductor device 10 is provided with a lead frame 1 which is a "conductor substrate" called in the present invention. Though not illustrated, if the semiconductor device is provided with a heat-dissipating plate of which the outermost layer is formed of copper or an alloy thereof, then, the heat-dissipating plate may be regarded to be a conductor substrate of the present invention. In the following description, in particular, the conductor substrate is described by reference to the lead frame. However, any other member may be regarded to be the conductor substrate.

The conductor substrate is constituted from a metal member of which the outermost layer is formed of copper or an alloy thereof by taking the heat-dissipating property into consideration. That is, the conductor substrate may be substantially made of copper or an alloy thereof, or may be substantially made of a non-copper metal with the proviso that the outermost layer is at least formed of copper or an alloy thereof. In the latter case, the non-copper metal may be, for example, an FeNi alloy. Further, in this case, copper or an alloy thereof may be applied to form the outermost layer by plating or by any other film-forming method.

The conductor substrate is usually provided in the form of a thin plate, and is worked into a lead frame or any other shape by press working, etching, etc.

In the conductor substrate of the invention, it is essential that at least a portion of the conductor substrate is covered with a layer of copper oxide containing a hydroxide. In the illustrated semiconductor device 10, the conductor substrate (lead frame) 1 is covered with a layer 2 of hydroxide-containing copper oxide over its substantial portions, i.e., except a silver-plated layer 3 for connection to external units. Thus, by covering at least the back surface of the IC chip-mounting portion or, preferably, by covering the whole surface thereof with the hydroxide-containing copper oxide layer, the adhesion of the sealing resin to the lead frame is improved. The layer 2 of the hydroxide-containing copper oxide can be formed through a surface treatment of the conductor substrate of which at least the outermost surface layer is formed of copper or an alloy thereof, at a small layer thickness by using a simple method at a low temperature within a short period of time.

In the present invention, the surface treatment for forming the hydroxide-containing copper oxide layer is based on the specific or forced oxidation of the conductor substrate, and is preferably accomplished by either one of the following two methods or, as required, by a combination of the two methods.

(1) Use of a Blackening Treatment Solution Having an Oxidation Reinforcing Agent Added Thereto The surface treatment usually employs only the blackening treatment solution which is particularly called herein, "black oxide treatment solution". In the present invention, however, an oxidizing agent (called, particularly, "oxidation reinforcing agent" in the present invention) having excellent self-reducing force is added to the black oxide treatment solution and, then, the conductor substrate is immersed in the oxidizing agent-containing black oxide treatment solution. Note that, if used herein, the term "blackening" or "black oxide treatment" is intended to mean a conversion treatment for chemically forming an oxide layer on a surface of copper or an alloy thereof.

(2) Use of the Blackening Treatment Solution (Black Oxide Treatment Solution) and the Anodization in Combination The conductor substrate is immersed in the black oxide treatment solution and is anodized in the solution.

Surprisingly, it is noted that either one of these surface treatment methods can be carried out at temperatures lower than that of the conventional blackening method (immersion method) and within a shortened period of time to complete the treatment. In practice, the surface treatment step can be usually conducted at a temperature of as relatively low as about 50 to 80° C. and is completed within a shortened period of time of about 1 to 20 seconds. This is because, according to the discovery by the present inventors, in the case of the present invention, a thin layer of the hydroxide-containing copper oxide is sufficient for obtaining a large degree of adhesion strength, and also the oxidation reaction proceeds quickly.

Further, since the surface treatment is accomplished within a shortened period of time as described above, the oxidation treatment is conducted after the silver layer is plated on the conductor substrate for, for example, wire bonding without contaminating the plated silver layer. Therefore, the conductor substrate and the conductor substrate plated with silver can be subjected to an oxidation treatment in the form of a hoop or a sheet by an in-line process, suppressing the cost yet greatly improving the productivity as compared to the oxidation treatment by immersion as represented by the conventional blackening method. The plated layers for wire bonding are not limited to the silver-plated layers only but may be, for example, palladium-plated layers or any plated layers.

A semiconductor element 5 is mounted on the lead frame 1 at a predetermined position. Though not illustrated, any bonding medium such as an adhesive sheet, die-bonding material, etc. is usually used for bonding the lead frame 1 and the semiconductor element 5 together. The semiconductor element 5 is, for example, an IC chip or an LSI chip. In the illustrated embodiment, one semiconductor element 5 is mounted, however, as required, two or more semiconductor elements may be mounted. In place of the semiconductor element or in combination with the semiconductor element, there may be mounted any active element or passive element. Namely, in the practice of the invention, there is no particular limitation on the kind of the semiconductor element to be mounted.

The semiconductor element 5 has its external connection terminals (not shown) connected to the silver-plated layers 3 of the lead frame 1 via bonding wires 8. The bonding wires 8 are fine wires made of, for example, gold (Au) or aluminum (Al). What is important here is that when the copper oxide layer is formed by the conventional blackening method, the silver-plated layer 3, too, is oxidized making it difficult to bond, for example, Au wires 8 to the silver-plated layer 3. Contrary to this, according to the present invention, the copper oxide layer is quickly formed upon the surface treatment. Therefore, the silver-plated layer 3 is not undesirably oxidized and, hence, the wire bonding method is conducted by using Au wires without any problem. As required, further, a flip-chip (FC) method may be used instead of the illustrated wire-bonding method.

In the illustrated semiconductor device 10, substantially the whole portion (functioning portion of the semiconductor device) inclusive of a portion mounting the semiconductor element 3 is filled or sealed with an insulating resin 9, and both ends of the lead frame 1 or the external lead portions only are exposed. The sealing resin 9 works to protect the semiconductor device 10 from the external moisture or shocks and encompasses any insulating resin so far as it does not adversely affect the effects of the invention. In the practice of the invention, a resin containing a hydroxyl group in the molecules is used as an insulating resin to effectively produce a hydrogen bonding force between the hydroxide-containing copper oxide layer (underlying layer) and the resin. Examples of a suitable sealing resin, although not restricted to, include an epoxy resin, a polyimide resin, a phenol resin and a vinyl chloride resin. Particularly, the epoxy resin is useful for the practice of the invention, since it produces a strong hydrogen bonding force between the epoxy resin and the hydrogen-containing copper oxide layer formed on the surface of the conductor substrate, preventing the occurrence of defects such as cracks and the peeling of resin.

Formation of the hydroxide-containing copper oxide layer according to the present invention will be described below in further detail.

According to the present invention, as described above, the thin copper oxide layer can be formed within a shortened period of time either by using the black oxide treatment solution to which the oxidation reinforcing agent is added or by using the black oxide treatment solution and the anodization in combination. FIG. 4 is attached to explain these layer formation methods, and shows a graph plotting the thicknesses of the copper oxide layer, i.e., a cuprous oxide ($Cu_2O$) layer and a cupric oxide (CuO) layer formed by using an untreated copper alloy relying upon different methods:

1) Conventional blackening method for 10 seconds;
2) Method of the invention (using the black oxide treatment solution containing an oxidation reinforcing agent added, treated for 5 seconds);
3) Method of the invention (using the black oxide treatment solution containing an oxidation reinforcing agent added, treated for 10 seconds);
4) Method of the invention (using the black oxide treatment solution and the anodization in combination, treated for 2 seconds);
5) Method of the invention (using the black oxide treatment solution and the anodization in combination, treated for 10 seconds); and
6) Conventional blackening method for 240 seconds.

The layer thickness was measured in accordance with a cathode reduction method.

As will be understood from the graph of FIG. 4, with the conventional blackening method which has heretofore been widely adopted, the treatment must be conducted for about 4 minutes to obtain a layer thickness of about 0.6 µm which is necessary for improving the adhesion and, besides, the treating temperature of about 100° C. is necessary. On the other hand, with the method of the present invention, the satisfactory layer thickness is in the range of about 0.1 to 0.15 µm, and the treating time is about 10 seconds in a low-temperature region of about 70° C. Further, with the method of the present invention, even when the treating time is shortened, the adhesion is improved and the oxide layer ($Cu_2O$ layer) is obtained. The oxide layer obtained has a thickness of about 0.02 to 0.05 µm, and exhibits an improved resin adhesion as explained later with reference to FIG. 8 despite the thickness is smaller than the $Cu_2O$ layer of a thickness of 0.05 µm that is obtained in the conventional blackening method for 10 seconds.

Figure 5A:
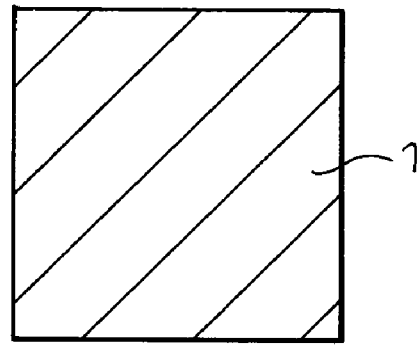
FIGS. 5A to 5C are sectional views illustrating, in sequence, the steps for forming a hydroxide-containing copper oxide layer according to the method of the present invention.

According to the present invention, a layer of copper oxide containing a hydroxide can be formed in the uppermost portion of the layer within a shortened period of time. This mechanism can be easily comprehended from FIGS. 5A to 5C which are sectional views illustrating, in sequence, the steps of forming a hydroxide-containing copper oxide layer according to the method of the invention. Referring, first, to FIG. 5A, a conductor substrate 1 of copper (or an alloy thereof) is prepared and is then subjected to an oxidation treatment. Note, however, in a single alkali bath usually used as a base for the conventional blackening solution that since Cu can be dissolved in the form of $CuO_2^{2-}$, the oxidation treatment cannot be attained. In the conventional blackening solution, copper can be oxidized by the oxidizing force of an oxidizing agent, if such agent is added. However, to obtain a sufficiently high rate of oxidation, it is necessary to carry out the treatment at high temperatures, because when the treatment is conducted at a low temperature, the dissolving rate exceeds the oxidizing rate due to the oxidizing agent, and thus a favorable oxide layer cannot be formed.

Contrary to this, according to the present invention, an oxidation reinforcing agent having excellent self-reducing force such as sodium permanganate is added to the black oxide treatment solution (alkali bath, specifically, alkali bath containing a strong alkaline compound and an oxidizing agent as main components), or alternatively, the black oxide treatment solution (alkali bath) is used in combination with the anodization to carry out the oxidation treatment at low temperatures. Further, since the treatment is conducted at low temperatures, $CuO_2^{2-}$ produced upon dissolution can precipitate as cupric hydroxide $Cu(OH)_2$.

Figure 5B:
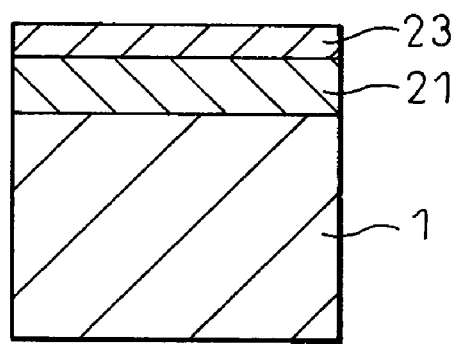

(1) Use of a Black Oxide Treatment Solution Having an Oxidation Reinforcing Agent Added Thereto In the initial stage of the reaction, there are formed a cuprous oxide $Cu_2O$ layer 21 and a cupric hydroxide $Cu(OH)_2$ layer 23 on an upper surface of the conductor substrate 1 as illustrated in FIG. 5B. Here, the following two reactions take place.

$$2Cu+O^{2-} \rightarrow Cu_2O+2e \qquad \text{Reaction (1):}$$

$$Cu_2O+O^{2-} \rightarrow 2CuO+2e \qquad \text{Reaction (2):}$$

Figure 5C:
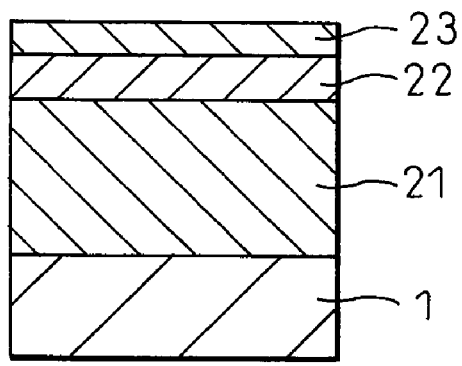

Here, the reaction rate of the reaction (1) is greater than that of the reaction (2). As shown in FIG. 5C, therefore, there is formed a composite oxide layer which is a target layer of the invention, i.e., a three-layered structure comprising the cuprous oxide $Cu_2O$ layer 21, a cupric oxide CuO layer 22 and the cupric hydroxide $Cu(OH)_2$ layer 23. Namely, simultaneously with the formation of the $Cu_2O$ layer and the CuO layer, $CuO_2^{2-}$ formed upon dissolution of copper undergoes the following reaction with water molecules:

$$CuO_2^{2-}+2H_2O \rightarrow Cu(OH)_2+2OH^-$$

to form $Cu(OH)_2$. Further, the resulting $Cu(OH)_2$ is precipitated on the underlying cupric oxide layer 22 as shown.

(2) Use of the Black Oxide Treatment Solution and the Anodization in Combination In the initial stage of reaction, there are formed a cuprous oxide $Cu_2O$ layer 21 and a cupric hydroxide $Cu(OH)_2$ layer 23 on a top surface of the conductor substrate 1 as illustrated in FIG. 5B. Here, the following two reactions take place.

$$2Cu+H_2O \rightarrow Cu_2O+2H^++2e \qquad \text{Reaction (1):}$$

$$Cu_2O+H_2O \rightarrow 2CuO+2H^++2e \qquad \text{Reaction (2):}$$

Here, the reaction rate of the reaction (1) is greater than that of the reaction (2). As shown in FIG. 5C, therefore, there is formed a composite oxide layer which is a target layer of the invention, i.e., a three-layered structure comprising the cuprous oxide $Cu_2O$ layer 21, the cupric oxide CuO layer 22 and the cupric hydroxide $Cu(OH)_2$ layer 23. Namely, simultaneously with the formation of the $Cu_2O$ layer and the CuO layer, $CuO_2^{2-}$ formed upon dissolution of copper undergoes the following reaction with $H^+$ generated upon anodization:

$$CuO_2^{2-}+2H^+ \rightarrow Cu(OH)_2$$

to form $Cu(OH)_2$. Further, the resulting $Cu(OH)_2$ is precipitated on the underlying cupric oxide layer 22 as shown.

Figure 24:
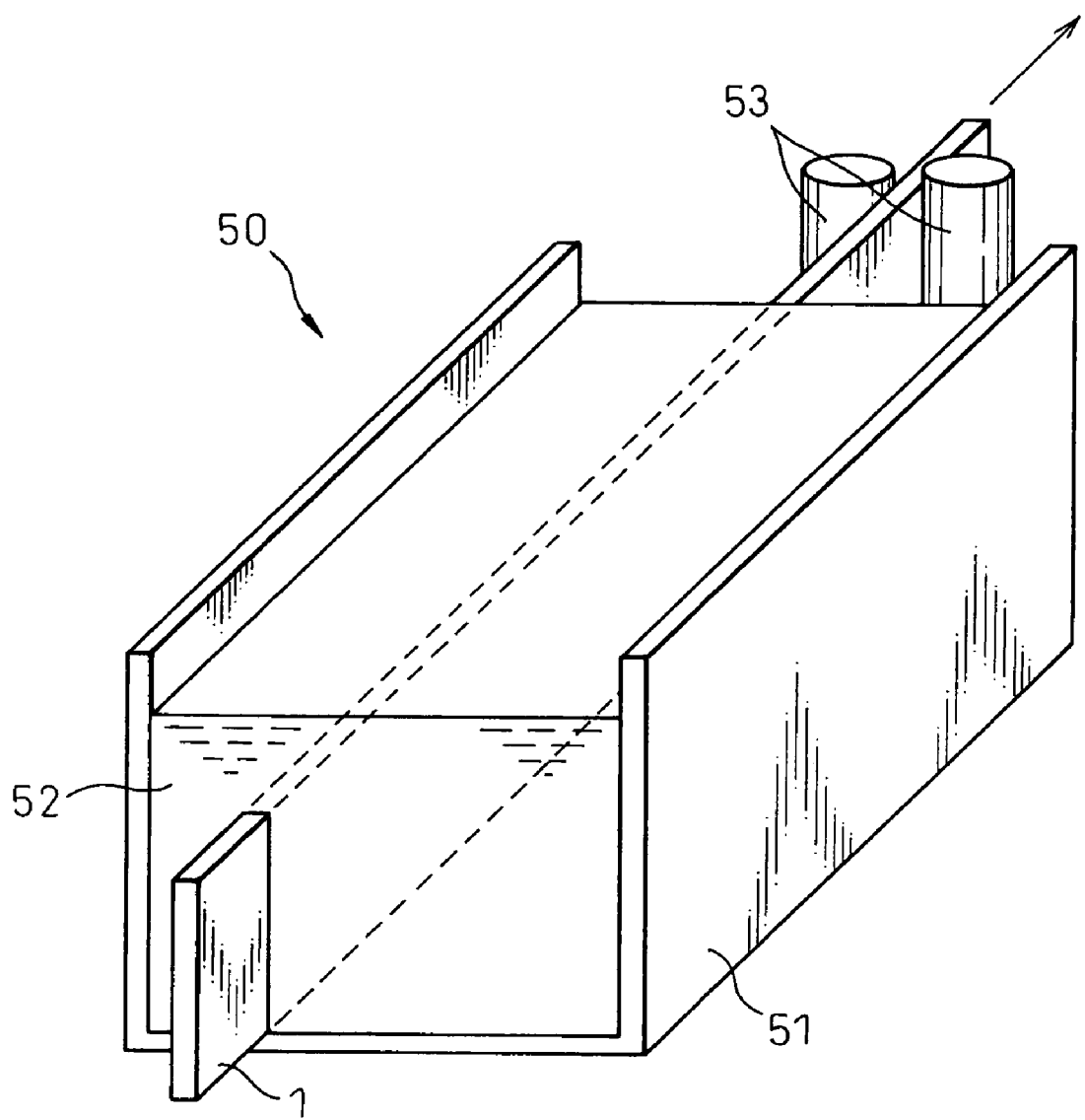
FIG. 24 is a perspective view schematically illustrating a method of black oxide treatment in the presence of an oxidation reinforcing agent according to the present invention.
Figure 25:
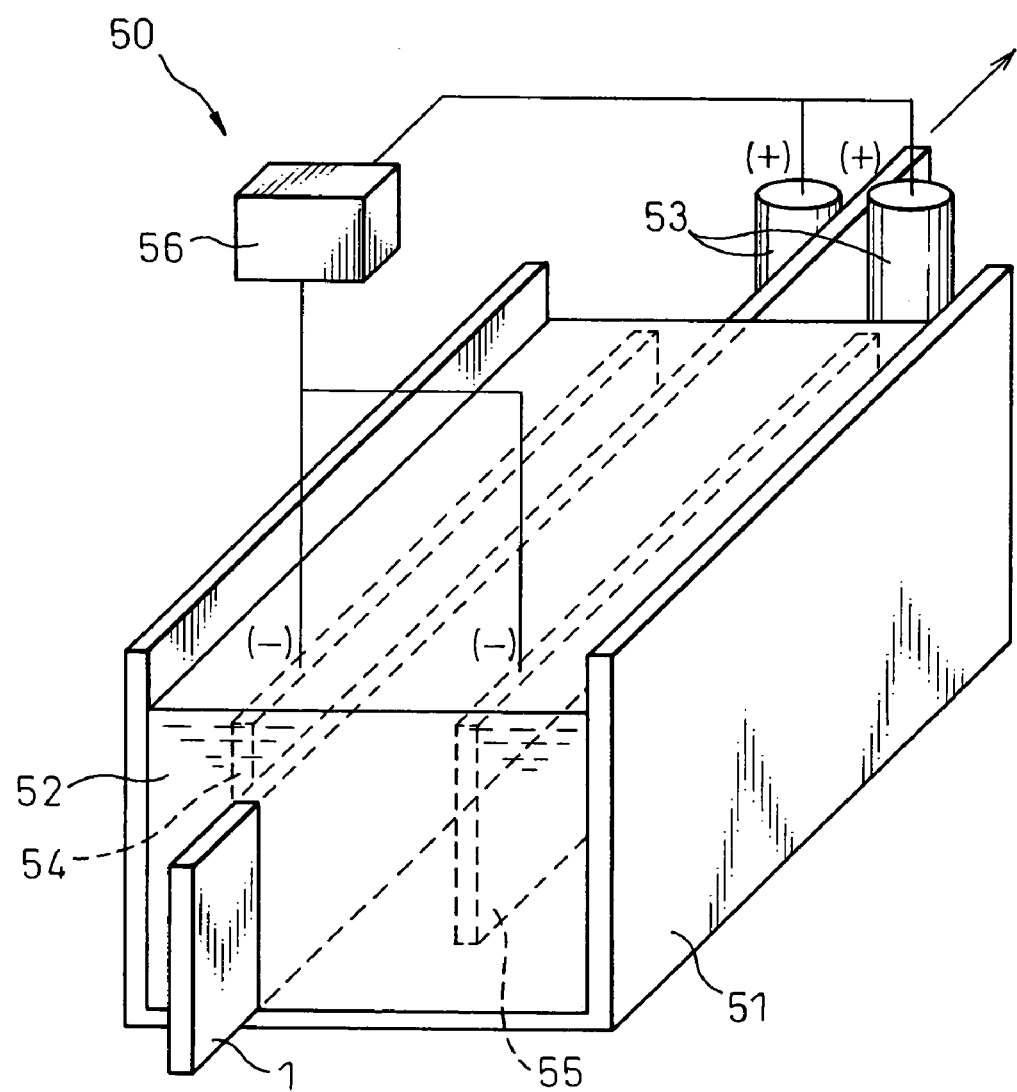
FIG. 25 is a perspective view schematically illustrating a method of anodization in a black oxide treatment solution according to the present invention.

In the practice of the present invention, the hydroxide-containing copper oxide layer is formed by using a treatment apparatus schematically illustrated in, for example, FIGS. 24 and 25. FIG. 24 illustrates a treatment apparatus for carrying out the black oxide treatment in the presence of an oxidation reinforcing agent according to the invention, and FIG. 25 illustrates a treatment apparatus for carrying out the anodization in the black oxide treatment solution according to the invention.

Referring, first, to FIG. 24, a treatment apparatus 50 comprises a treatment vessel 51 and a treatment solution 52. A hoop-like or sheet-like conductor substrate 1 immersed in the treatment vessel 51 can be conveyed in a direction of an arrow by the attached guide rollers 53. The treatment solution is maintained at a bath temperature of, for example, about 70° C., and the residence time of the conductor substrate 1 is about 5 to 20 seconds. That is, the time for treating the conductor substrate 1 is set to be about 5 to 20 seconds by adjusting the rotational speed of the guide rollers 53.

As previously described, the treatment solution is one prepared by adding an oxidation reinforcing agent having excellent self-reducing force to a black oxide treatment solution, and is a mixture of a strong alkaline compound, an oxidizing agent and an oxidation reinforcing agent. The strong alkaline compound used herein is not limited to a particular compound but is, preferably, sodium hydroxide or potassium hydroxide. The strong alkaline compounds may be used alone or in a mixture of two or more compounds. The oxidizing agent used in combination may be the one that is usually used for the preparation of the black oxide treatment solution and is not limited to any particular compound but is, preferably, for example, sodium chlorite. There is no particular limitation on the oxidation reinforcing agent that is added to the black oxide treatment solution according to the present invention so far as it has excellent self-reducing force. Preferably, however, the oxidation reinforcing agent is sodium permanganate, sodium bichromate or sodium peroxodisulfate. The oxidation reinforcing agents may be used alone or in a mixture of two or more agents. Further, any additive may be added to the treatment solution, in addition to the strong alkaline compound, oxidizing agent and oxidation reinforcing agent.

The treatment solution can be used, for example, in the following composition and under the following treating conditions.

| | |
|---|---|
| Sodium chlorite (NaClO₂) | 5 to 100 g/L |
| Sodium hydroxide (NaOH) | 5 to 60 g/L |
| Trisodium phosphate (Na₃PO₄) | 0 to 200 g/L |
| Sodium permanganate (NaMnO₄) | 50 to 100 g/L |

Treating Conditions:

| | |
|---|---|
| Bath temperature | about 50 to 80° C. |
| Treating time | about 5 to 20 seconds |

Referring, next, to FIG. 25, a treatment apparatus 50 for anodization comprises a treatment vessel 51 and a treatment solution 52. A hoop-like or sheet-like conductor substrate 1 immersed in the treatment vessel 51 can be conveyed in a direction of an arrow by attached guide rollers 53. The treatment vessel 51 further has two platinum electrode plates (−) 54 and 55 connected to a rectifier 56 for anodization. The guide rollers 53 are also connected to the rectifier 56 to provide feeder rollers (+). The treatment solution for anodization is maintained at a bath temperature of, for example, about 70° C., and the residence time of the conductor substrate 1 is about 1 to 20 seconds. That is, the time for treating the conductor substrate 1 is set to be about 1 to 20 seconds by adjusting the rotational speed of the guide rollers 53. The electric current applied for the anodization may be either a pulse current or a direct current, and the current density is about 0.2 to 10 A/dm².

As described above, the treating solution for anodization by itself may have a same composition as that of the conventional blackening solution and thus contains a strong alkaline compound and an oxidizing agent as main components. The strong alkaline compound and the oxidizing agent used herein are as described above. Further, any additive may be added to the treatment solution in addition to the strong alkaline compound and the oxidizing agent.

The treatment solution for anodization can be used, for example, in the following composition and under the following treating conditions.

| | |
|---|---|
| Sodium chlorite (NaClO₂) | 0 to 100 g/L |
| Sodium hydroxide (NaOH) | 5 to 60 g/L |
| Trisodium phosphate (Na₃PO₄) | 0 to 200 g/L |

Treating Conditions:

| | |
|---|---|
| Bath temperature | about 50 to 80° C. |
| Treating time | about 1 to 20 seconds |
| Current density: | about 0.2 to about 10 A/dm² |

Figure 6:
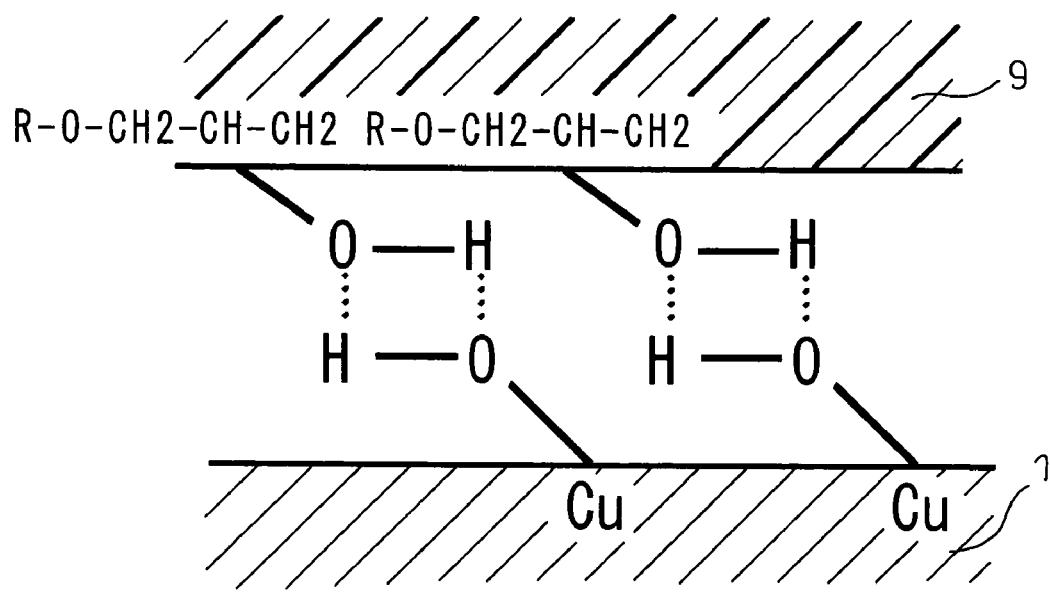
FIG. 6 is a sectional view schematically illustrating a mechanism of bonding the hydroxide-containing copper oxide layer and an epoxy resin together in the semiconductor device of the present invention.

In the semiconductor device of the present invention, as described above, the hydroxide-containing copper oxide layer of the conductor substrate, an outermost surface of which is formed of copper or a copper alloy, is bonded through the hydrogen bonding force to the sealing resin covering the surface of the copper oxide layer to obtain a strong adhering force imparting very excellent reliability to the resulting semiconductor device. Generation of hydrogen bonding force of the present invention will be easily understood from FIG. 6 which is a sectional view schematically illustrating a mechanism of bonding between the hydroxide-containing copper oxide layer 1 and the epoxy resin 9 in the semiconductor device of the present invention. The hydroxide in the hydroxide-containing copper oxide layer 1 generates a strong adhering force upon being hydrogen-bonded to the hydroxyl group (—OH) formed by the curing of the epoxy resin 9. So far as the present inventors know, there is no proposal in the prior art to reinforce the adhering force as a result of incorporation of hydroxide in copper oxide.

Figure 7:
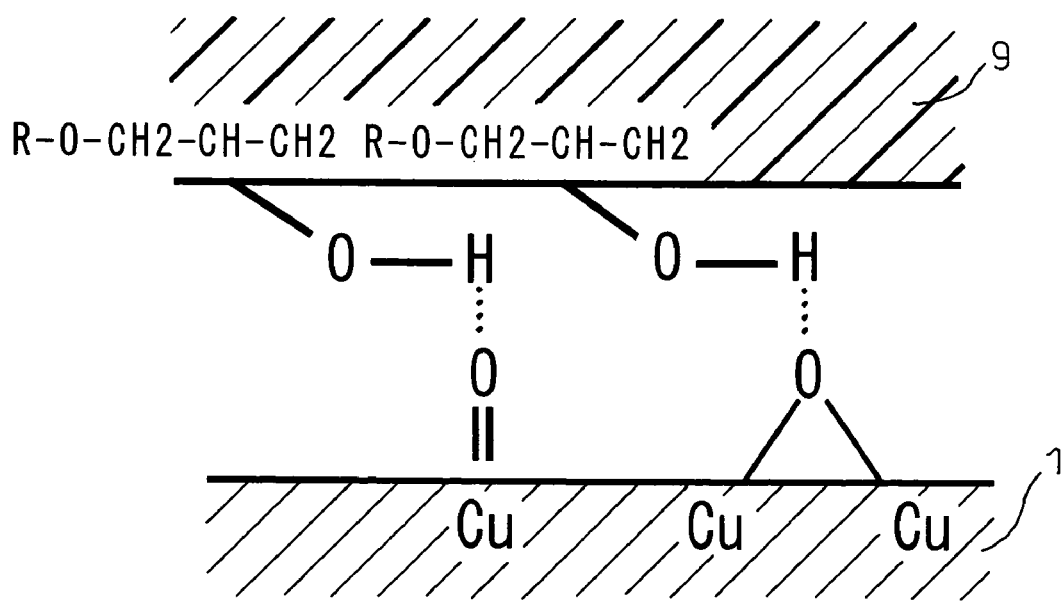
FIG. 7 is a sectional view schematically illustrating a mechanism of bonding the hydroxide-containing copper oxide layer and the epoxy resin together in a conventional semiconductor device.

Contrary to this, in the case of the conventional semiconductor device, as schematically illustrated in FIG. 7, the copper oxide layer 1 on the surface of the conductor substrate (copper or copper alloy) and the epoxy resin 9 are only weakly bonded together, generating only a weak adhering force, without precluding such problems as occurrence of cracks and peeling of the molding resin.

Moreover, in order to make sure the generation of such a hydrogen bonding force from the viewpoint of chemical structure, the present inventors have observed different copper oxide layers with regard to the presence of hydroxyl groups (—OH) based on the hydroxide, using the Fourier transform infrared spectroscopy (FT-IR). Confirmation of the presence of hydroxyl groups (—OH) proves the generation of the hydrogen bonding force. The following four kinds of copper oxide layer samples were prepared for the analysis.

Sample I:
  Conventional blackening method for 10 seconds

Sample II:
  Method of the invention (treated for 10 seconds, using the black oxide treatment solution containing an oxidation reinforcing agent added)

Sample III:
  Method of the invention (treated for 10 seconds, using the black oxide treatment solution and the anodization in combination)

Sample IV:
  Method of the invention (treated for 120 seconds, using the black oxide treatment solution and the anodization in combination)

Figure 26:
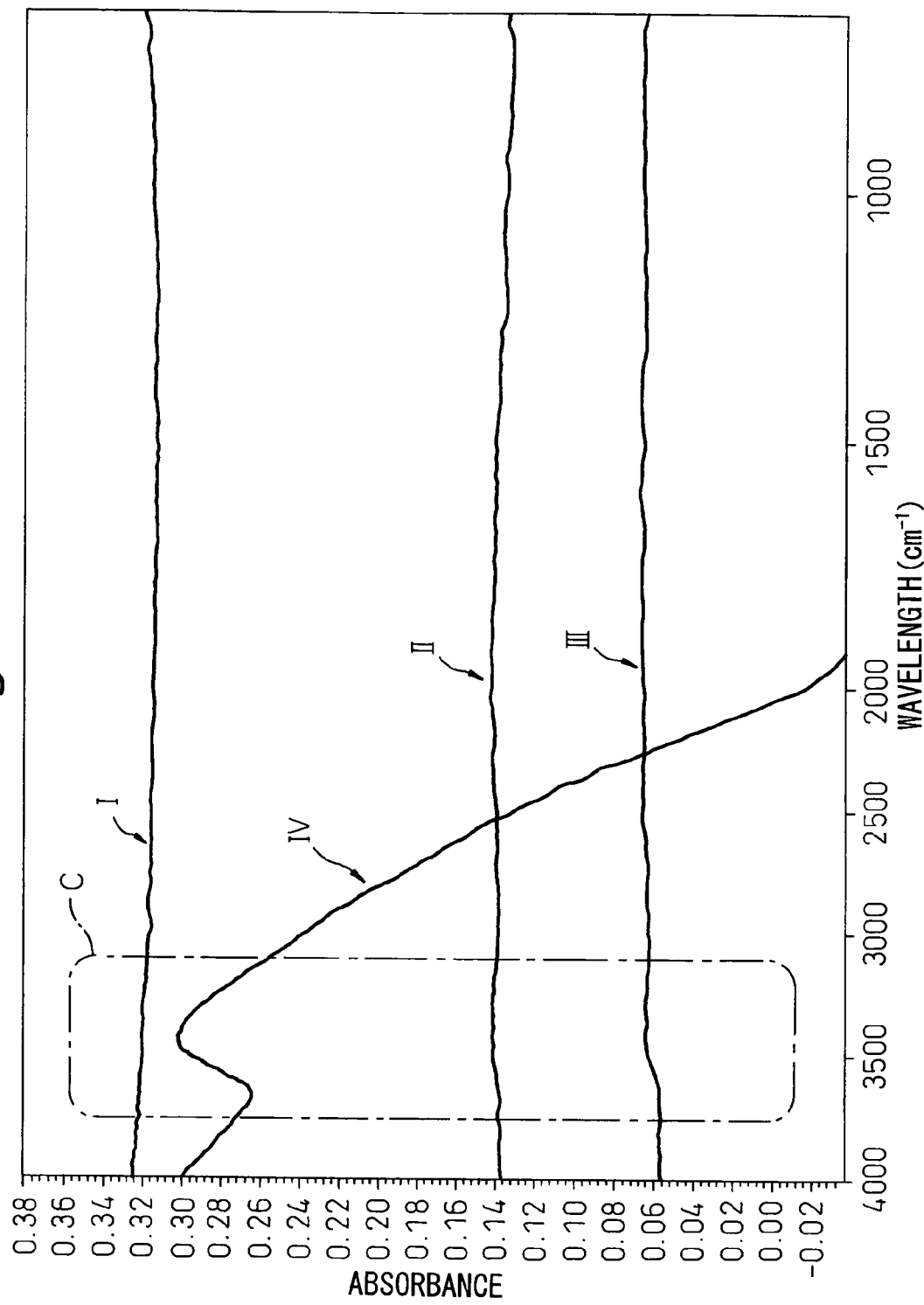
FIG. 26 is a graph summarizing the results of Fourier transform infrared ray spectroscopy (FT-IR) of different copper oxide layers.

Referring to the analytical results of FIG. 26, a region C represents a peak due to —OH groups (wavelength: about 3400 cm⁻¹) based on the hydroxide. In FIG. 26, the samples have very thin layers of copper oxide and exhibit relatively small peaks due to —OH groups. However, the presence of the hydroxide can be confirmed from an increase in the layer thickness (sample IV is an amplified example).

In the case of the sample I (prior art), no hydroxide is contained in the copper oxide layer, and a peak due to —OH group is not recognized. In the case of the sample II of the invention, on the other hand, a peak due to —OH group is recognizable though it is mild. In the case of the sample III of the invention, too, a peak due to —OH group is recognizable though it is mild like in the case of the sample II. In order to make sure whether a peak due to —OH group can be reliably recognized in the sample of the invention, the present inventors have extended the anodization time to 120 seconds as represented by the sample IV to clearly confirm the presence of the peak due to —OH group. From the above analytical results, it is obvious that the copper oxide layer formed by the method of the invention can generate a hydrogen bonding force between the copper oxide layer and the epoxy resin due to presence of hydroxide contained therein.

Figure 8:
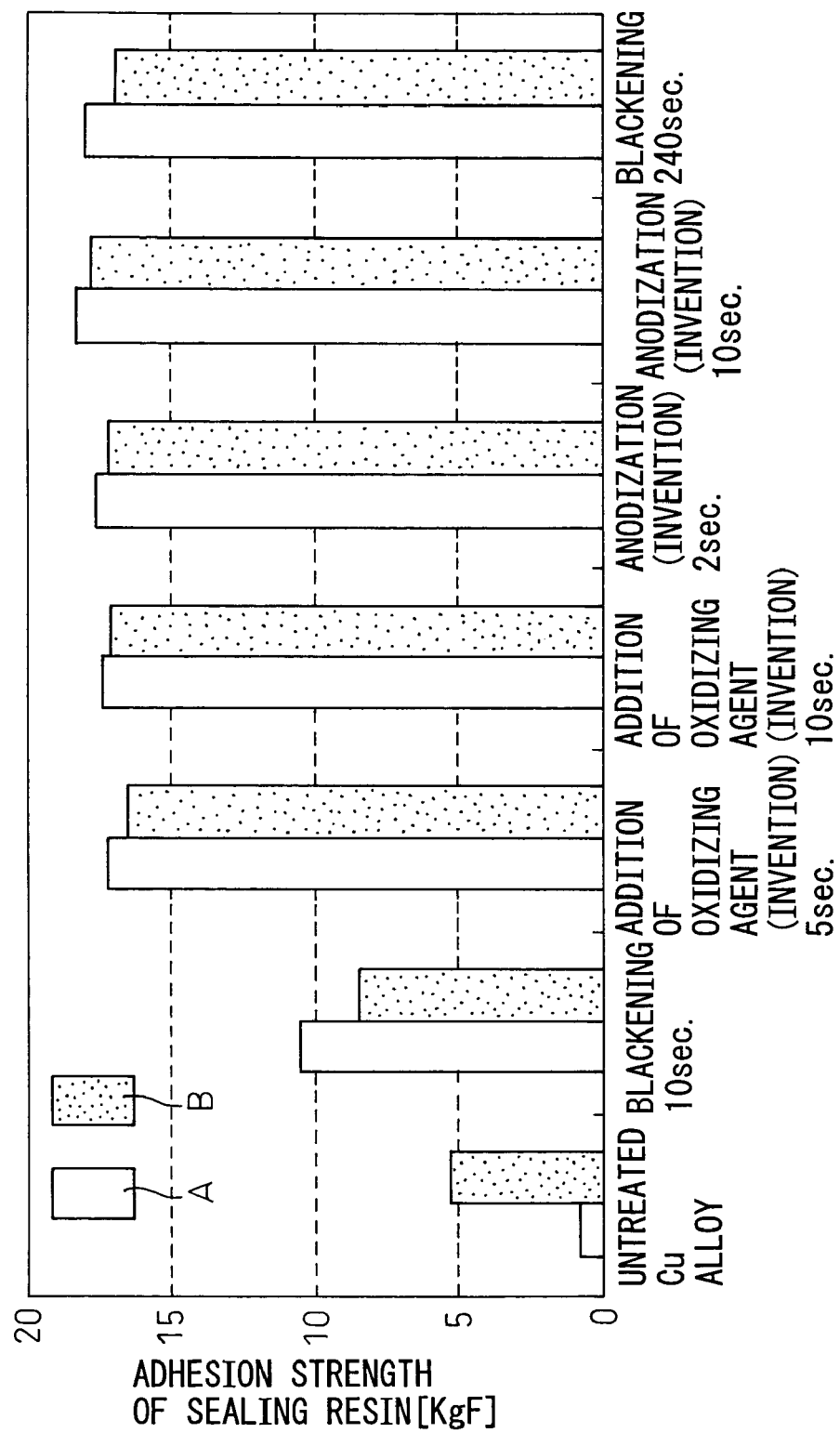
FIG. 8 is a graph illustrating variations in the adhesion strength of the sealing resin of when copper oxide layers are formed by different methods inclusive of the method of the present invention.

FIG. 8 is a graph plotting the test results of adhesion of the sealing resin conducted for making sure a strong adhering force stemming from the hydrogen bonding force. The following seven conductor substrates were prepared as samples.

1) Untreated copper alloy;
2) Copper alloy treated by a conventional blackening method for 10 seconds;
3) Copper alloy treated by the method of the invention (treated for 5 seconds using the black oxide treatment solution containing an oxidation reinforcing agent added);
4) Copper alloy treated by the method of the invention (treated for 10 seconds using the black oxide treatment solution containing an oxidation reinforcing agent added);
5) Copper alloy treated by the method of the invention (treated for 2 seconds using the black oxide treatment solution and the anodization in combination);
6) Copper alloy treated by the method of the invention (treated for 10 seconds using the black oxide treatment solution and the anodization in combination); and
7) Copper alloy treated by a conventional blackening method for 240 seconds.

Thicknesses of the copper oxide layers are as described already with reference to FIG. 4. The individual samples were sealed with the resin (epoxy resin) over an area of 10.2 mm$^2$. Treatment was made before sealing and after sealing under the following testing conditions A and B, and an adhesion strengths (KgF) of the sealing resin was measured. Note that the treatment before and after sealing applied herein was conducted by taking into consideration the practical production of the semiconductor devices; i.e., the pre-treatment was conducted simulating the curing step at the time of mounting the chip and the wire-bonding step, and the after-treatment was conducted simulating the solder reflowing step.

Test A:
No heating before sealing of the epoxy resin+heating (300° C.×10 seconds) after sealing Test B:
Heating (150° C.×3 hours+270° C.×5 minutes) before sealing of the epoxy resin+heating (300° C.×10 seconds) after sealing As will be understood from the test results of FIG. 8, according to the conventional method, the strength of adhesion of the sealing resin becomes comparable to that of the method of the present invention only when the layer thickness is increased whereas according to the method of the present invention, a satisfactorily large adhesion strength of the sealing resin is obtained even when the layer has a small thickness.

The present inventors have further observed the surface states of the above-mentioned five samples (measuring range: 4 μm$^2$) by using a scanning electron microscope (SEM, ×10,000) and an atomic force microscope (AFM, ×10,000), along with determination of the average surface roughness Ra. The results of measurement are shown in FIGS. 9 to 13.

Figure 9:
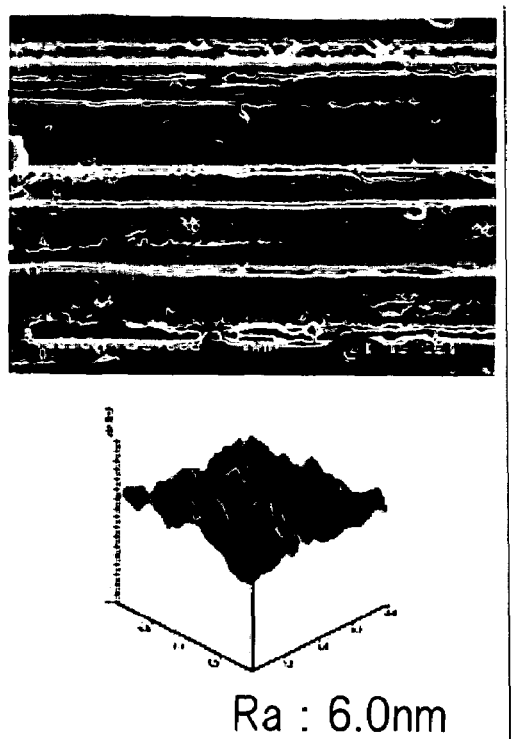
FIG. 9 is a diagram illustrating the surface state of an untreated copper alloy with regard to a photograph taken by using a scanning electron microscope (SEM, ×10,000) and a surface analysis obtained by using an atomic force microscope (AFM, ×10,000)

FIG. 9—Untreated copper alloy

Figure 10:
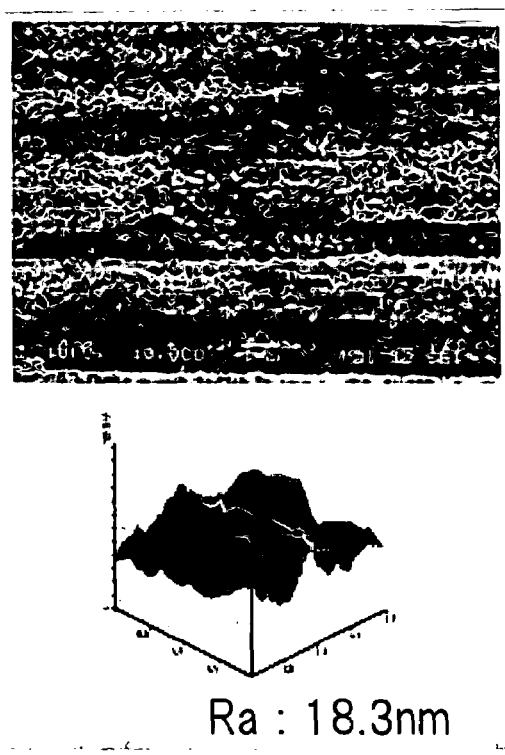
FIG. 10 is a diagram illustrating the surface state of the copper alloy after black oxide treatment for 10 seconds with regard to a photograph taken by using a scanning electron microscope (SEM, ×10,000) and a surface analysis obtained by using an atomic force microscope (AFM, ×10,000)

FIG. 10—Copper alloy treated by a conventional blackening method for 10 seconds FIG. 11—Copper alloy treated by the method of the invention (treated for 10 seconds using the black oxide treatment solution containing oxidation reinforcing agent added)

FIG. 12—Copper alloy treated by the method of the invention (treated for 10 seconds using the black oxide treatment solution and the anodization in combination)

Figure 13:
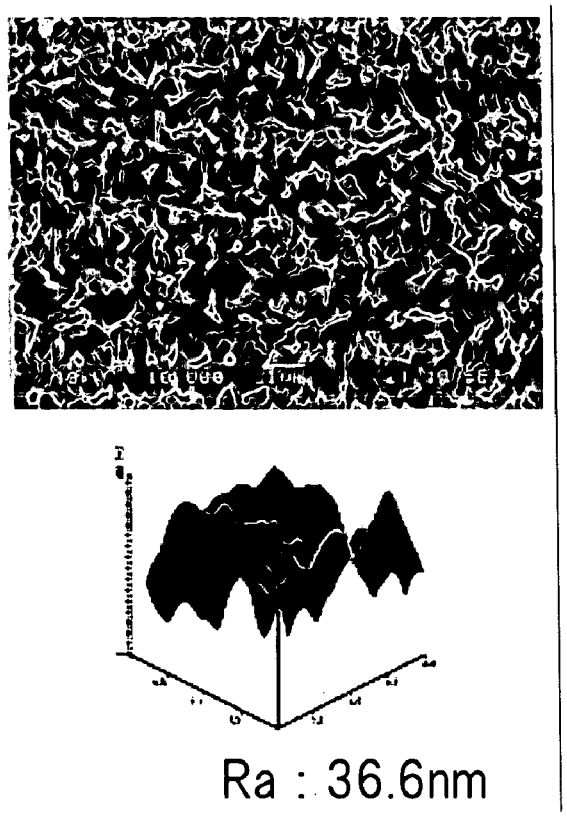
FIG. 13 is a diagram illustrating the surface state of the copper alloy after black oxide treatment for 240 seconds with regard to a photograph taken by using a scanning electron microscope (SEM, ×10,000) and a surface analysis obtained by using an atomic force microscope (AFM, ×10,000)

FIG. 13—Copper alloy treated by a conventional blackening method for 240 seconds As will be understood from these drawings, the hydroxide-containing copper oxide layer formed according to the method of the present invention is constituted from fine needle-like crystals. The needle-like crystals have particle sizes of not larger than about 0.5 μm.

Further, the method of the present invention makes it possible to avoid a phenomenon in that the elements added to the copper alloy are concentrated due to the heat in the step of producing the semiconductor device and in the solder reflowing step and that the sealed resin is peeled off the conductor substrate. This is because the copper oxide layer formed according to the conventional method has a segregated layer, whereas the hydroxide-containing copper oxide layer, formed by the method of the present invention does not have such a segregated layer. A difference between these two layers will now be described with reference to FIGS. 14 and 15.

Figure 14:
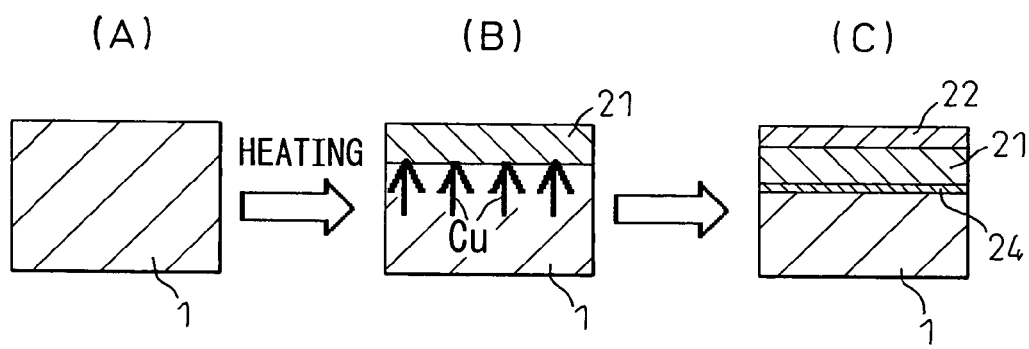
FIG. 14 is a sectional view illustrating, in sequence, a mechanism of forming a segregated layer due to the added elements when the untreated copper alloy is heat-treated.
Figure 15:
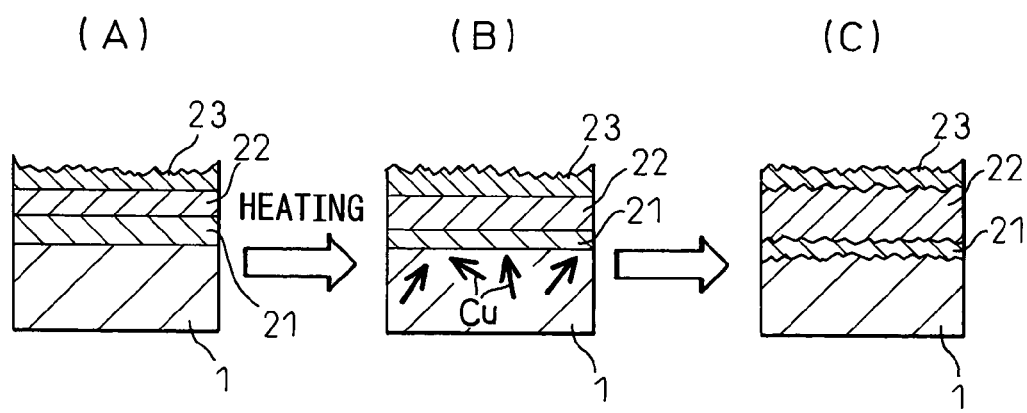
FIG. 15 is a sectional view illustrating, in sequence, a mechanism in which no segregated layer is formed by the added elements when the copper alloy oxidized according to the method of the present invention is heat-treated.
Figure 16:
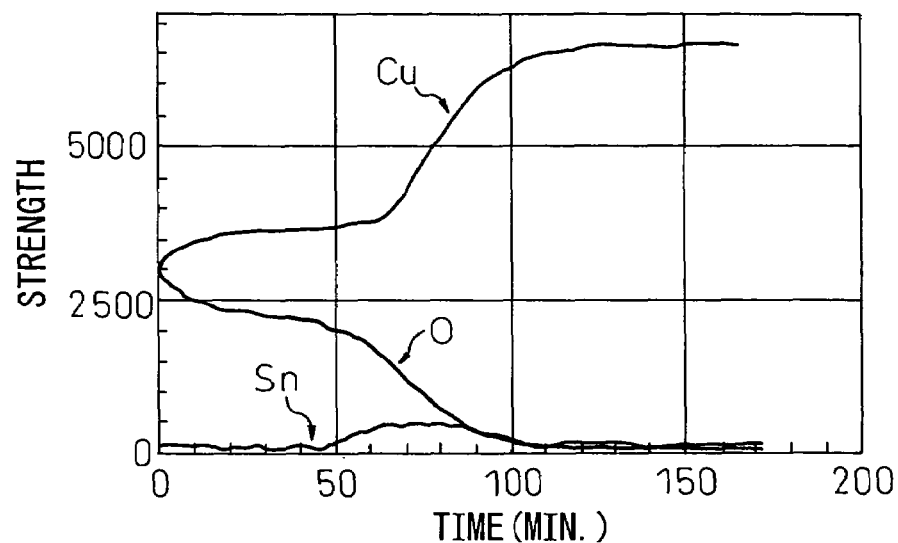
FIG. 16 is a graph illustrating the results of when the untreated copper alloy is analyzed by AES in the direction of depth.

When the untreated copper alloy is heat-treated, as successively illustrated in FIG. 14, a segregated layer is formed due to elements contained in the copper alloy. Referring, first, to step (A) of FIG. 14, there is prepared a copper alloy used as a conductor substrate 1. The copper alloy usually contains such elements as Sn and Ni as additives. Then, as the conductor substrate 1 is heated, a cuprous oxide (Cu$_2$O) layer 21 is formed in the surface portion of the conductor substrate 1. Here, copper (Cu) element in the conductor substrate 1 is homogeneously diffused as shown. As a result, a segregated layer 24 is formed as shown in step (C) of FIG. 14 due to the added elements that are remaining. Further, a cupric oxide (CuO) layer 22 is formed on the cuprous oxide (Cu$_2$O) layer 21. When the copper oxide film is thus formed, a very brittle segregated layer 24 exists on the conductor substrate 1, giving rise to the occurrence of a serious problem in that the sealed resin peels off (peels off the segregated layer 24).

On the other hand, when the untreated copper alloy is oxidized according to the present invention, it is allowed to form a layer of the hydroxide-containing copper oxide without forming the segregated layer due to heating. Namely, when the conductor substrate 1 of a copper alloy containing such elements as Sn and Ni as additives is oxidized by using the black oxide treatment solution containing an oxidation reinforcing agent added or using the black oxide treatment solution and the anodization in combination, there are formed, as illustrated in step (A) of FIG. 15, the cuprous oxide (Cu$_2$O) layer 21, the cupric oxide (CuO) layer 22 and the hydroxide-containing cuprous hydroxide layer 23 having a rough surface in this order from the side of the conductor substrate 1. When heated in this surface state, copper (Cu) element in the conductor substrate 1 is unhomogeneously diffused due to ruggedness in the surface portion as illustrated in step (B) of FIG. 15. As a result, even if the added elements are left, there is formed no segregated layer as illustrated in step (C) of FIG. 15. In the case of the hydroxide-containing cuprous oxide layer 23 formed by the method of the present invention, therefore, the semiconductor device exhibits an enhanced heat resistance, since peeling off of the sealing resin due to presence of the segregated layer can be avoided.

In order to confirm the formation of the segregated layer caused by the concentration of elements added to the copper alloy, the present inventors have analyzed the following four samples in the direction of depth by using an Auger electron spectroscopic analyzer (AES). The copper alloy of the samples used herein was a commercially available product (name "MF202") containing a trace amount of tin (Sn). The heating condition was 300° C.×5 minutes, and the etching rate using the argon gas was 26 Å/min (SiO$_2$).

Sample 1:
   Untreated copper alloy (MF202)

Sample 2:
   Copper alloy treated by the method of the invention (treated for 10 seconds using the black oxide treatment solution and the anodization in combination)

Sample 3:
   Copper alloy treated by the method of the invention (treated for 10 seconds using the black oxide treatment solution containing an oxidation reinforcing agent added)

Sample 4:
   Copper alloy treated by a conventional blackening method for 10 seconds FIGS. 16 to 19 are graphs plotting the results of AES analysis of the samples 1 to 4. From the Sn peaks in FIG. 16 (sample 1) and FIG. 19 (sample 4), it is learned that the Sn segregated layer has been formed in these conventional samples.

Figure 17:
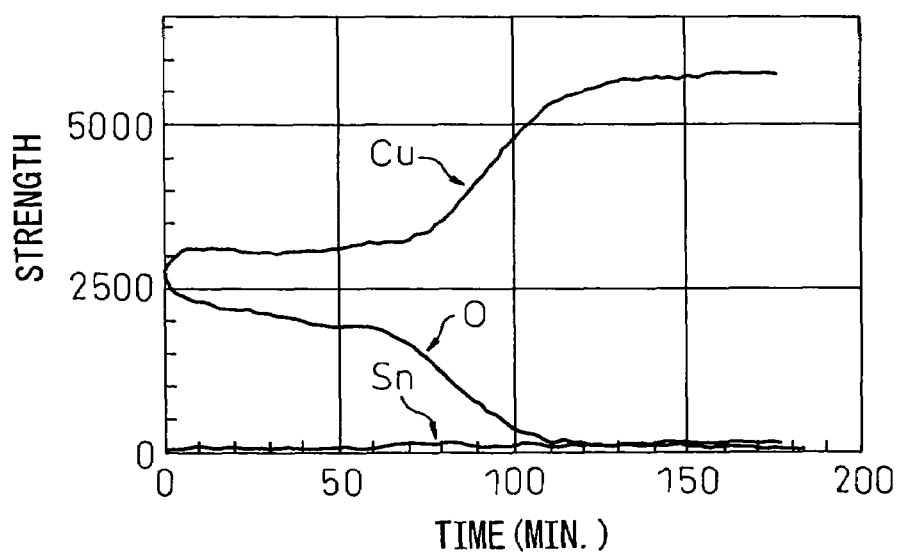
FIG. 17 is a graph illustrating the results of when the copper alloy obtained after anodization treatment for 10 seconds according to the present invention is analyzed by AES in the direction of depth.
Figure 18:
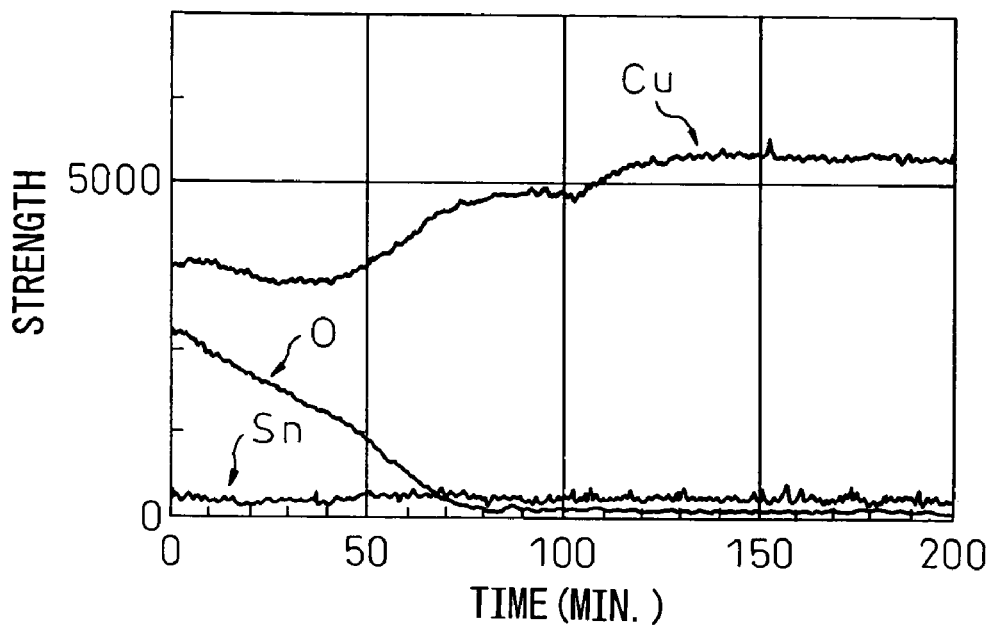
FIG. 18 is a graph illustrating the results of when the copper alloy obtained after black oxide treatment for 10 seconds in the presence of an oxidation reinforcing agent according to the present invention is analyzed by AES in the direction of depth.
Figure 19:
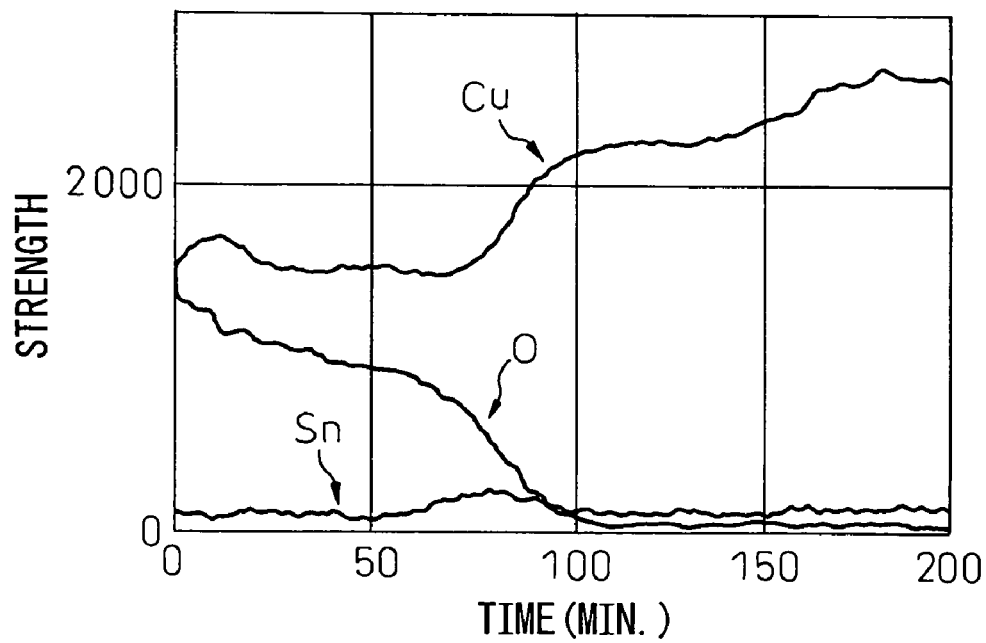
FIG. 19 is a graph illustrating the results of when the copper alloy obtained after black oxide treatment for 10 seconds is analyzed by AES in the direction of depth.
Figure 20:
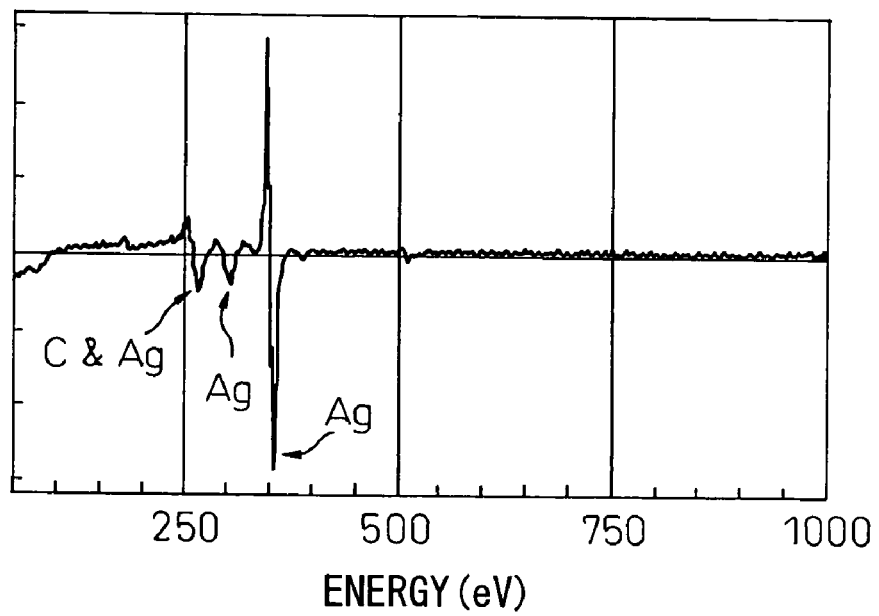
FIG. 20 is a graph illustrating the results of when the untreated copper alloy obtained after plating with silver is qualitatively analyzed by AES for its silver-plated surface.
Figure 21:
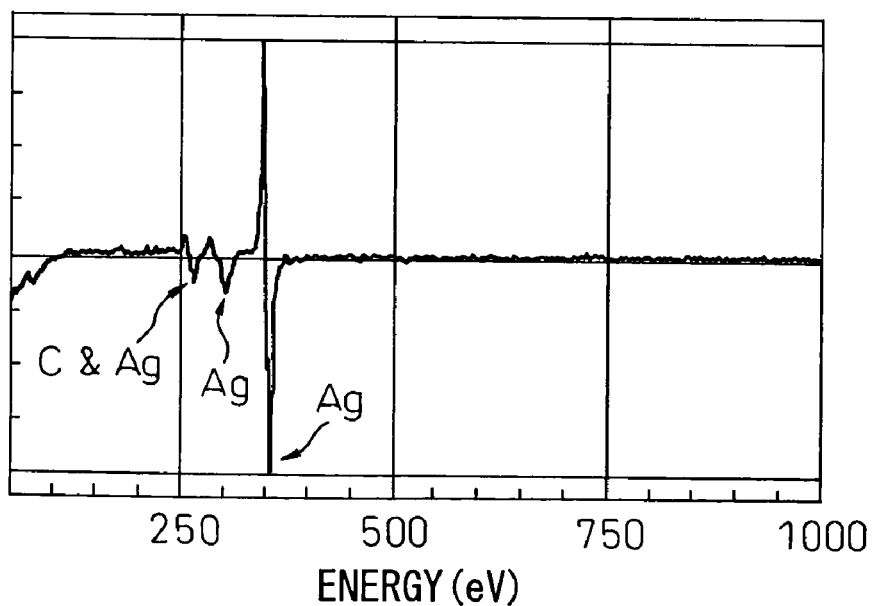
FIG. 21 is a graph illustrating the results of when the untreated copper alloy obtained after plating with silver followed by anodizing for 10 seconds according to the present invention is qualitatively analyzed by AES for its silver-plated surface.
Figure 22:
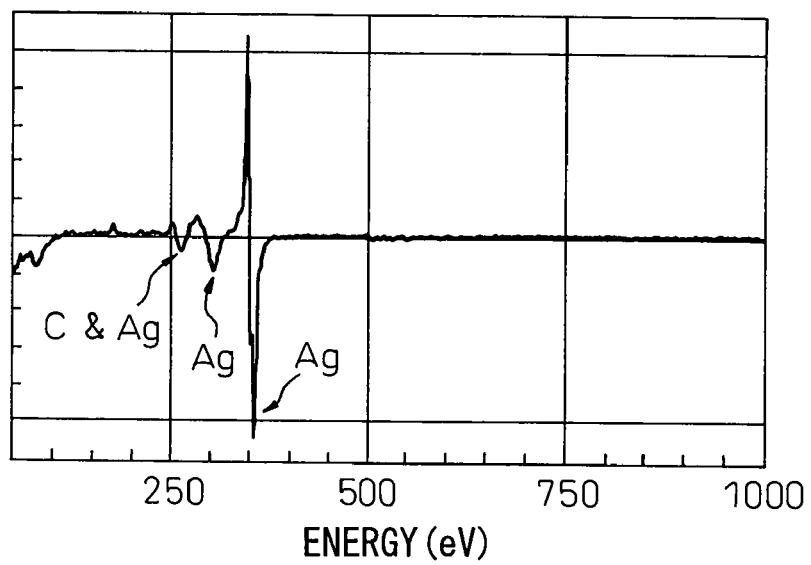
FIG. 22 is a graph illustrating the results of when the untreated copper alloy obtained after plating with silver, followed by black oxide treatment for 10 seconds in the presence of an oxidation reinforcing agent according to the present invention is qualitatively analyzed by AES for its silver-plated surface.

On the other hand, in FIG. 17 (sample 2) and FIG. 18 (sample 3), there is no Sn peak from which it is learned that no Sn segregated layer is formed by the method of the present invention.

Further, when the hydroxide-containing copper oxide layer is formed according to the method of the present invention, the silver (Ag)-plated layer is not contaminated in the step of forming the copper oxide layer unlike the case of forming the copper oxide layer according to the conventional method. In order to confirm this effect, the present inventors have formed a copper oxide layer on a copper alloy which has been partly plated with an Ag layer, and have qualitatively analyzed the Ag-plated layer neighboring the copper oxide layer to evaluate the contamination. The copper alloy of the samples used herein was a commercially available product (name "MF202") containing a trace amount of tin (Sn).

Sample 1:
   Untreated copper alloy (MF202)

Sample 2:
   Copper alloy treated by the method of the invention (treated for 10 seconds using the black oxide treatment solution and the anodization in combination)

Sample 3:
   Copper alloy treated by the method of the invention (treated for 10 seconds using the black oxide treatment solution containing an oxidation reinforcing agent added)

Figure 23:
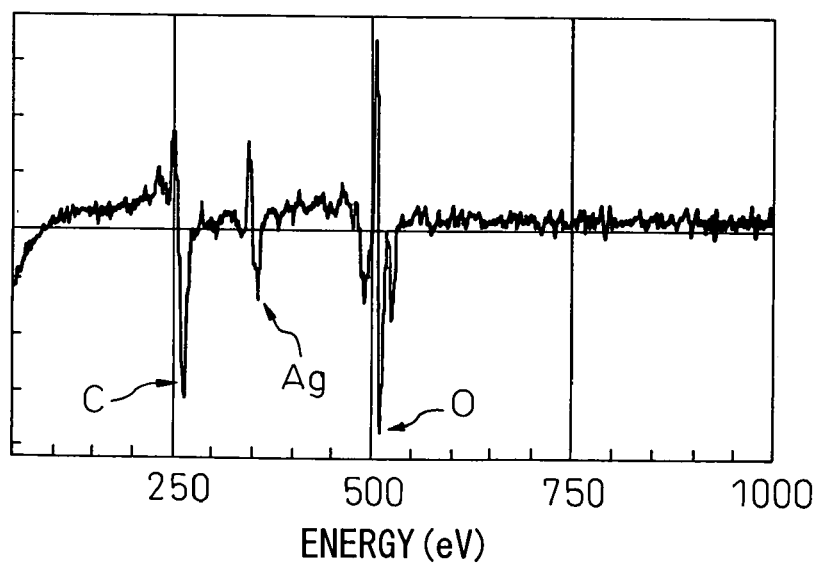
FIG. 23 is a graph illustrating the results of when the untreated copper alloy obtained after plating with silver, followed by black oxide treatment for 240 seconds is qualitatively analyzed by AES for its silver-plated surface.

Sample 4:
   Copper alloy treated by a conventional blackening method for 240 seconds FIGS. 20 to 23 are graphs plotting the results of AES analysis of the samples 1 to 4. Referring to FIG. 23, in the case of the sample 4 (prior art), there clearly exists a peak due to oxygen (O) adversely affecting the Ag plating. On the other hand, the samples 2 and 3 (present invention) have the same profile as that of the sample 1 (untreated copper alloy) exhibiting absence of oxygen (O) that adversely affects the Ag plating.

Further, the hydroxide-containing copper oxide layer formed according to the method of the present invention has excellent heat resistance compared to that of the copper oxide layer formed according to the conventional method, and favorably adheres to the underlying conductor substrate. To confirm this effect, the present inventors have conducted a tape peeling test by using the following five samples (ten for each sample) according to the following procedure. The copper alloy used herein as the conductor substrate was "CDA194" (Fe: 2.35% by weight; P: 0.07% by weight; Zn: 0.12% by weight; Cu: balance), and had a size of 30×10 mm.

Sample A:
   Untreated copper alloy (CDA194)

Sample B:
   Copper alloy treated by a conventional blackening method for 10 seconds Sample C:
   Copper alloy treated by the method of the invention (treated for 10 seconds using the black oxide treatment solution containing an oxidation reinforcing agent added)

Sample D:
   Copper alloy treated by the method of the invention (treated for 10 seconds using the black oxide treatment solution and the anodic oxidation in combination)

Sample E:
   Copper alloy treated by a conventional blackening method for 240 seconds The respective samples were placed on a hot plate heated at 300° C. and were heated in the atmosphere for different periods of time (10 minutes, 15 minutes, 20 minutes, 25 minutes and 30 minutes). Then, an adhesive tape (trade name, "SCOTCH™ #810", manufactured by 3M Co.) was applied to a surface of the sample to conduct the tape peeling test in compliance with JIS H 8504 (Plating Adhesion Testing Method—Tape Testing). The obtained test results are summarized in Table 1 below. In Table 1, ○ represents that the copper oxide layer was not peeled off, Δ represents that the copper oxide layer was partly peeled off, and X represents the copper oxide layer was entirely peeled off.

TABLE 1

| | 300° C. × heating time [heating on hot plate in atmosphere] | | | | |
|---|---|---|---|---|---|
| | 10 min. | 15 min. | 20 min. | 25 min. | 30 min. |
| A. Untreated Cu alloy | ○ | Δ | Δ | X | X |
| B. Blackening; 10 sec. | ○ | ○ | ○ | Δ | X |
| C. Addition of oxidizing agent (Invention); 10 sec. | ○ | ○ | ○ | ○ | ○ |
| D. Anodization (Invention); 10 sec. | ○ | ○ | ○ | ○ | ○ |
| E. Blackening; 240 sec. | ○ | ○ | ○ | ○ | ○ |

According to the present invention, as will be understood from the measurement results in Table 1, there is obtained a hydroxide-containing copper oxide layer featuring excellent adhesion at high temperatures. Even when heated at a temperature as high as 300° C. for an extended period of time, therefore, the layer does not peel off unlike the conventional films. In the case of the conventional layer, for example, the adhesion comparable to that of the present invention can be obtained only when a thick layer is formed by continuously conducting the blacking method for 4 minutes as represented by the sample E.

The invention claimed is:

1. A conductor substrate for mounting a semiconductor element, at least a portion of the conductor substrate, on which said semiconductor element is to be mounted, being sealed with an insulating resin, wherein an uppermost surface layer of said conductor substrate comprises copper or an alloy thereof, said conductor substrate is partly or entirely covered with a layer of copper oxide containing a hydroxide formed by surface treatment of said conductor substrate, and said layer of hydroxide-containing copper oxide has a three-layered structure comprising, in sequence, a cuprous oxide ($Cu_2O$) layer, a cupric oxide (CuO) layer and a cupric hydroxide ($Cu(OH)_2$) layer from the side of said conductor substrate.

2. A conductor substrate according to claim 1, wherein said conductor substrate substantially comprises copper or an alloy thereof.

3. A conductor substrate according to claim 1, wherein said conductor substrate substantially comprises a non-copper metal and the uppermost surface layer of said conductor substrate comprises copper or an alloy thereof.

4. A conductor substrate according to claim 1, wherein said surface treatment is a forced oxidation treatment which comprises immersing said conductor substrate in a black oxide treatment solution having added thereto an oxidizing agent having an excellent self-reducing force.

5. A conductor substrate according to claim 1, wherein said surface treatment is a forced oxidation treatment which comprises anodization of said conductor substrate while immersing said conductor substrate in a black oxide treatment solution.

6. A conductor substrate according to claim 1, wherein said insulating resin is a resin comprising a hydroxyl group in the molecule thereof, and a hydrogen bonding force is generated between said hydroxyl group-containing resin and said layer of hydroxide-containing copper oxide.

7. A conductor substrate according to claim 6, wherein said hydroxyl group-containing resin is an epoxy resin.

8. A conductor substrate according to claim 1, wherein said conductor substrate is a lead frame.

9. A conductor substrate according to claim 1, wherein said layer of hydroxide-containing copper oxide is covering at least a portion of the surface of said conductor substrate except for wire-drawing portions.

10. A conductor substrate according to claim 1, wherein said layer of hydroxide-containing copper oxide is covering the whole surface of said conductor substrate.

11. A conductor substrate according to claim 1, wherein said conductor substrate is a heat-dissipating plate.

12. A conductor substrate according to claim 1, wherein said layer of hydroxide-containing copper oxide has a thickness in a range of 0.02 to 0.2 µm.

13. A conductor substrate according to claim 1, wherein no segregated layer is formed between said conductor substrate and said layer of hydroxide-containing copper oxide when treated under a high-temperature condition.

14. A conductor substrate according to claim 1, wherein said layer of hydroxide-containing copper oxide comprises needle-like crystals having particle sizes of not larger than 0.5 µm.

15. A semiconductor device in which at least one semiconductor element is mounted on a predetermined position of a conductor substrate described in claim 1, and said conductor substrate is sealed with an insulating resin.

16. A semiconductor device according to claim 15, wherein said conductor substrate is substantially entirely sealed with said insulating resin.

17. A semiconductor device according to claim 15, wherein said semiconductor device is mounted on a mounting substrate using a solder.

18. A semiconductor device according to claim 17, wherein said solder is a lead-free solder.

19. A semiconductor device, comprising:
  a substrate having a surface including a mounting portion to receive and mount thereon a semiconductor element; and
  an outermost layer of copper oxide containing a hydroxide substantially covering the substrate surface, wherein
  said layer of copper oxide has a three-layered structure comprising, in sequence, a cuprous oxide ($Cu_2O$) layer, a cupric oxide (CuO) layer and a cupric hydroxide ($Cu(OH)_2$) layer from the side of said substrate.

20. A semiconductor device as recited in claim 19, further comprising:
  an insulating resin covering substantially all of the substrate and the semiconductor element.

21. A semiconductor device as recited in claim 19, wherein the outermost layer is formed by surface treatment of the substrate surface.

* * * * *